(12) United States Patent
Yang

(10) Patent No.: US 11,586,113 B2
(45) Date of Patent: Feb. 21, 2023

(54) METHODS AND APPARATUS FOR POST EXPOSURE BAKE PROCESSING OF A WORKPIECE

(71) Applicants: Mattson Technology, Inc., Fremont, CA (US); Beijing E-Town Semiconductor Technology Co., Ltd., Beijing (CN)

(72) Inventor: Michael X. Yang, Palo Alto, CA (US)

(73) Assignees: MATTSON TECHNOLOGY, INC, Fremont, CA (US); BEIJING E-TOWN SEMICONDUCTOR TECHNOLOGY, CO., LTD, Beijing (CN)

( * ) Notice: Subject to any disclaimer, the term of this patent is extended or adjusted under 35 U.S.C. 154(b) by 929 days.

(21) Appl. No.: 16/402,405

(22) Filed: May 3, 2019

(65) Prior Publication Data
US 2019/0384178 A1    Dec. 19, 2019

Related U.S. Application Data

(60) Provisional application No. 62/735,244, filed on Sep. 24, 2018, provisional application No. 62/685,608, filed on Jun. 15, 2018.

(51) Int. Cl.
*G03F 7/40* (2006.01)
*G03F 7/20* (2006.01)
*H01L 21/027* (2006.01)

(52) U.S. Cl.
CPC ............ *G03F 7/202* (2013.01); *G03F 7/2041* (2013.01); *G03F 7/40* (2013.01); *H01L 21/0274* (2013.01)

(58) Field of Classification Search
CPC ............... G03F 7/26; G03F 7/202; G03F 7/40
See application file for complete search history.

(56) References Cited

U.S. PATENT DOCUMENTS

| | | | |
|---|---|---|---|
| 6,018,616 A | 1/2000 | Schaper | |
| 6,185,370 B1 | 2/2001 | Sekimoto et al. | |
| 6,494,955 B1 | 12/2002 | Lei et al. | |
| 7,156,924 B2 | 1/2007 | Renken | |
| 2001/0053500 A1 | 12/2001 | Jeoung et al. | |
| 2003/0010289 A1 | 1/2003 | Gurer et al. | |
| 2003/0209425 A1 | 11/2003 | Talieh et al. | |
| 2006/0238954 A1 | 10/2006 | Ishikawa et al. | |
| 2007/0003279 A1 | 1/2007 | Park | |
| 2008/0050688 A1 | 2/2008 | Timans | |
| 2009/0014431 A1 | 1/2009 | Oh et al. | |
| 2011/0059622 A1 | 3/2011 | Huang et al. | |
| 2015/0355549 A1 | 12/2015 | Xie et al. | |
| 2016/0085154 A1 | 3/2016 | Fukuoka et al. | |
| 2018/0021806 A1 | 1/2018 | Inagaki | |

FOREIGN PATENT DOCUMENTS

| | | |
|---|---|---|
| JP | S5875154 A | 5/1983 |
| JP | H07111948 B2 | 11/1995 |
| JP | 2000146444 A | 5/2000 |
| JP | 2002023860 A | 1/2002 |
| JP | 2013069990 A | 4/2013 |
| JP | 2017525131 A | 8/2017 |

OTHER PUBLICATIONS

PCT International Search Report and Written Opinion for corresponding PCT Application No. PCT/US2019/030552, dated Aug. 13, 2019, 11 pages.
International Preliminary Report on Patentability for Application No. PCT/US2019/030552, dated Dec. 24, 2020, 7 pages.

*Primary Examiner* — Daborah Chacko-Davis
(74) *Attorney, Agent, or Firm* — Dority & Manning, P.A.

(57) ABSTRACT

Post exposure bake methods are provided. In one example, a method includes placing a workpiece having a photoresist layer on a workpiece support disposed in a processing chamber. The method includes exposing the photoresist to photons of a wavelength through a photomask. The method includes performing a post exposure bake heating process on the workpiece with the photoresist heating layer. The post exposure bake heating process can include heating the workpiece with both a radiant heat source and a second heat source disposed in the workpiece support until a temperature of the workpiece reaches a post exposure bake setpoint temperature.

12 Claims, 8 Drawing Sheets

METHODS AND APPARATUS FOR POST EXPOSURE BAKE PROCESSING OF A WORKPIECE

PRIORITY CLAIM

The present application claims the benefit of priority of U.S. Provisional Application Ser. No. 62/735,244 titled "Methods and Apparatus for Post Exposure Bake Processing of a Workpiece," filed Sep. 24, 2018, which is incorporated herein by reference. The present application claims the benefit of priority of U.S. Provisional Application Ser. No. 62/685,608, titled "Methods and Apparatus for Post Exposure Bake Processing of a Workpiece," filed on Jun. 15, 2018, which is incorporated herein by reference.

FIELD

The present disclosure relates generally to methods for post exposure bake processing of a workpiece, for instance, during lithography processes associated with semiconductor processing.

BACKGROUND

In semiconductor processing, device fabrication can include several lithography steps. Additionally, critical dimension (CD) of workpieces continues to shrink, and deep UV and extreme UV (EUV) lithography has become mainstream in the most advanced device production and development. Most advanced photolithography methodologies (e.g., deep UV and extreme UV) adopt chemically amplified resists (CARs). Chemical amplification for CARs is based on the generation of a chemically stable catalytic compound upon exposure. During a subsequent post-exposure bake (PEB) process, the photo-generated catalyst can initiate a chain reaction (e.g., one photochemical conversion can lead to several chemical reactions) resulting in a significant improvement in photoresist sensitivity.

In advanced lithography applications, the time required to reach a PEB temperature setpoint can be a critical parameter in controlling acid diffusion length in the CAR layer. A reduction of heat up time in PEB process can improve CD control, such as line-edge-roughness (LER) control. Conventional resistive heater block design can include resistive heating elements embedded in a heater base having a material of high thermal conductivity. Conventional resistive heater block design can have several limitations for PEB processes in advanced lithography. With a low thermal mass of the heater base materials, there can be an initial temperature drop up to a few degrees in heater block temperature upon placement of a cold workpiece on the hot heater block surface. Furthermore, conventional heater block control adopts a dynamic temperature control algorithm for resistive heating element power input, which needs to balance between the requirements of a fast response and a precise control. As a result, the response of conventional heater block can be slow to correct the initial heater block temperature drop upon placement of the cold workpiece without overshooting the PEB temperature setpoint. In addition, with only a physical contact between the workpiece with the heater block, it can take time for the workpiece to reach thermal equilibrium with the resistive heater block. As a result, conventional resistive heater technology for PEB processes can only heat workpieces to required temperature setpoints in a relatively long timeframe (e.g., greater than 15 seconds). The slow increase of workpiece temperature to the setpoint for CAR activation not only can limit PEB tool throughput, but also can result in a deterioration of CD control, including LER roughness control in advanced lithography.

SUMMARY

Aspects and advantages of embodiments of the present disclosure will be set forth in part in the following description, or may be learned from the description, or may be learned through practice of the embodiments.

One example aspect of the present disclosure is directed to a method for processing a workpiece. The method includes placing a workpiece having a photoresist layer on a workpiece support disposed in a processing chamber. The method includes exposing the photoresist to photons of a wavelength through a photomask. The method includes performing a post exposure bake heating process on the workpiece with the photoresist heating layer. The post exposure bake heating process includes heating the workpiece with both a radiant heat source and a second heat source disposed in the workpiece support until a temperature of the workpiece reaches a post exposure bake setpoint temperature.

Another example aspect of the present disclosure is directed to a method for processing a workpiece. The method includes exposing a photoresist layer on a workpiece to photons of a wavelength through a photomask. The method includes placing the workpiece having the chemically amplified resist layer on a workpiece support disposed within a processing chamber. The workpiece support comprising one or more fluid-based heating elements. The method includes performing a post exposure bake heating process on the chemically amplified resist layer on the workpiece on the workpiece support at a post exposure bake setpoint temperature.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to methods for implementing a post exposure bake (PEB) process for a workpiece having a photoresist layer, such as a chemically amplified resist (CAR) layer. In some embodiments, the PEB process can be a part of a lithography process in a semiconductor device fabrication process.

In some embodiments, the method can include implementing a fluid heater in conjunction with a workpiece support for implementing a PEB process for a workpiece with the CAR layer. For instance, a method for processing a workpiece can include placing a workpiece on a workpiece support within a processing chamber. The workpiece support can include one or more fluid heating elements. The PEB heating process can include transmitting heated fluids such as liquids through the one or more fluid heating elements (e.g., fluid channels) inside the workpiece support.

In some embodiments, the method can include heating the workpiece to about a PEB setpoint temperature. The PEB setpoint temperature can be a temperature specified in a process recipe, control routine, operator input, etc. for conducting the PEB process on the workpiece. In some embodiments, the PEB setpoint temperature can be between about 60° C. and about 150° C. The method can include maintaining the temperature of the workpiece at approximately the PEB setpoint temperature using the one or more fluid heating elements in the workpiece support for a PEB processing period. The method can include removing the workpiece from the processing chamber after completion of the PEB processing period.

In some embodiments, the one or more fluid heating elements can be configured to receive heated fluid from a heat exchanger disposed external to the processing chamber. The fluid may be a working liquid fluid such as water, oil, a glycol (e.g., ethylene glycol), or a mixture thereof. As an example, the working liquid fluid can be water when the PEB setpoint temperature is in the range of about 60° C. to about 80° C. Other suitable working liquid fluids may be chosen based on any desired or required PEB setpoint temperature.

The fluid may pass through the fluid heating element associated with the workpiece support to heat the workpiece and may be output back to the heat exchanger for re-heating. This fluid heating approach may benefit from having multiple available and interchangeable heat sources for the heat exchanger, including heat reclaimed from a plasma process, resistive heating, radiant heating, or other available heat. In this way, the fluid (e.g., as a liquid) can be in circulation between the fluid heating element and the heat exchanger.

The methods according to these example embodiments of the present disclosure can have a number of technical effects and benefits. For instance, the PEB heating process according to example embodiments of the present disclosure can provide improved heating uniformity through the workpiece support. The temperature of the workpiece support can also have an increased stability because of the higher thermal mass of heating fluid circulating through the workpiece support. Upon placement of the workpiece on the workpiece support, the initial workpiece support temperature drop can be small in comparison with that of the conventional resistive heater block design. In addition, after the initial workpiece support temperature drop upon placement of the workpiece on the workpiece support, the heating fluid based workpiece support design can provide a faster ramp of the workpiece support temperature back to the PEB setpoint temperature (e.g., less than about 15 seconds). Finally, different from the dynamic temperature control in the conventional heater block design, there is also reduced issue of any temperature overshoot of workpiece support or workpiece in PEB process with the heating fluid based workpiece support design.

Another example embodiment of the present disclosure uses a radiant heat source (e.g., a lamp or other radiant heat source) in conjunction with a second heat source (e.g. a heat source disposed within a workpiece support) to at least partially implement a PEB heating process on a workpiece with a photoresist layer, such as a CAR layer. For instance, the method can include placing a workpiece on a workpiece support disposed within a processing chamber. In some embodiments, the workpiece support can include one or more heating sources, such as resistive heating elements or liquid-fluid based heating elements. The method can include performing a PEB heating process on the workpiece with the CAR layer. The PEB heating process can include heating the workpiece with the CAR layer using both the heating source(s) associated with the workpiece support and the radiant heat source (e.g., one or more lamps) until a temperature of the workpiece reaches a PEB setpoint temperature. In some embodiments, the PEB setpoint temperature can be between about 60° C. and about 150° C.

Once the temperature of the workpiece reaches the PEB setpoint temperature, the method can include maintaining the temperature of the workpiece at approximately the PEB setpoint temperature using primarily the heating source(s) associated with the workpiece support for a PEB processing period. The radiant heating sources can be deenergized either partially or completely once the temperature of the workpiece reaches the PEB setpoint temperature. In some embodiments, the PEB setpoint temperature can be successfully reached in less than about 15 seconds. In some embodiments, the PEB setpoint temperature can be successfully reached in less than about 5 seconds.

The radiant heat sources can include one or more lamps, such as flash lamps, arc lamps, halogen lamps, incandescent lamps, or other lamp heat sources (e.g., light emitting diode (LED) lamp heat sources). Aspects of the present disclosure are discussed with reference to lamps for purposes of illustration and discussion. Other radiant heat sources, such as, but not limited to, a hot gas stream, one or more lasers, heat sources producing particle beams, heat sources producing RF, heat sources producing microwave, etc. can be used as radiant heat sources without deviating from the scope of the present disclosure.

In some embodiments, the one or more heat sources associated with the workpiece support can be a resistive heating element. In some other embodiments, the one or more heat sources associated with the workpiece support can include one or more fluid based heating elements. The one or more fluid based heating elements can be configured to receive heated fluids from a heat exchanger disposed external to the processing chamber. The fluid may be a working liquid fluid such as oil, water, glycol (e.g., ethylene glycol), or a mixture thereof (e.g. a mixture of water with glycol). As an example, the working liquid fluid can be water when the PEB setpoint temperature is in the range of about 60° C. to about 80° C. Other suitable working liquid fluids may be chosen based on any desired or required PEB heating setpoint temperature.

The methods according to example aspects of the present disclosure provide numerous technical benefits. For instance, use of the radiant heating elements in addition to the heat source(s) associated with the workpiece support can result in a faster heating of the workpiece to the PEB setpoint temperature when compared to an absence of the radiant heating elements. In some embodiments, the workpiece temperature can be increased to the PEB setpoint in less than 15 seconds. In some embodiments, the workpiece temperature can be increased to the PEB setpoint in less than 5 seconds. Accordingly, acid diffusion length for the CAR layer can be more tightly controlled during the PEB process.

Aspects of the present disclosure are discussed with reference to a "wafer" or semiconductor wafer for purposes of illustration and discussion. Those of ordinary skill in the art, using the disclosures provided herein, will understand that the example aspects of the present disclosure can be used in association with any semiconductor substrate or other suitable substrate. It should be appreciated that the workpiece can include a device side surface that can include one or more device structures, films, or layers. The workpiece can also include an opposing non-device side surface that can include no device structures. As used herein, use of the term "about" or "approximately" in conjunction with a numerical value is intended to refer to within ten percent (10%) of the stated numerical value.

Figure 1:
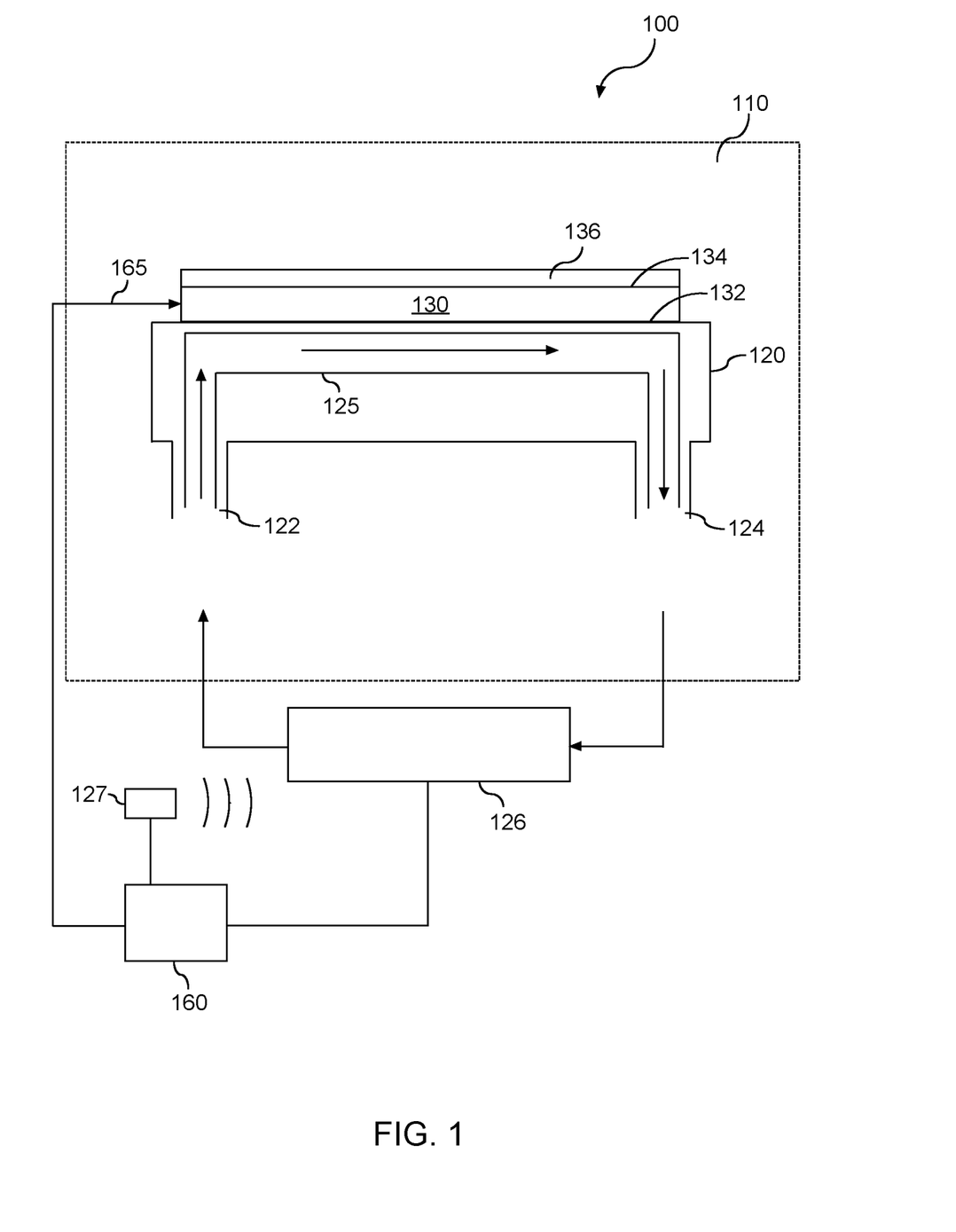
FIG. 1 depicts an example workpiece processing apparatus according to example embodiments of the present disclosure.

FIG. 1 depicts an example workpiece processing apparatus 100 that can be used to perform PEB heating processes on a workpiece having a photoresist layer (e.g., CAR layer) according to example embodiments of the present disclosure. The workpiece processing apparatus 100 can include a processing chamber 110. The processing chamber 110 can include a workpiece support 120 operable to support a workpiece 130 to be processed, such as a semiconductor wafer. The workpiece support 120 can include one or more liquid-fluid based heating element(s) 125 for regulating the temperature of the workpiece support 120. In some embodiments, the workpiece 130 can be placed on the liquid-fluid based heating element(s) 125 such that a non-device side surface 132 of the workpiece 130 contacts the liquid-fluid based heating element(s) 125. As further shown, the workpiece 130 includes a CAR layer 136 disposed on the device side 134 of the workpiece 130.

In some embodiments, the workpiece processing apparatus 100 can further include a heat exchanger 126 in fluid connection with the fluid based heating element(s) 125. The heat exchanger 126 can be configured to transmit heating fluid to fluid input 122 of the fluid heating element(s) 125. Similarly, the heat exchanger can be configured to receive fluid from the fluid output 124 of the fluid heating element(s) 125. In this way, the fluid (e.g. as a liquid) can be in circulation between the fluid heating element 125 and the heat exchanger 126.

In some embodiments, the fluid is a working liquid fluid chosen from the group consisting of water, oil, glycol, or a mixture thereof. In some embodiments, the working liquid fluid is ethylene glycol. In some embodiments, the working liquid fluid is chosen specifically for a particular target operating temperature of PEB setpoint temperature. As an example, the working fluid can be water when the PEB setpoint temperature is in the range of about 60° C. to about 80° C. Other suitable working fluids may be chosen based on any desired or required PEB heating setpoint temperature.

In some embodiments, the workpiece processing apparatus 100 can include a control device 160 that is operatively coupled to the heat exchanger 126. The control device 160 can be configured to control operation of the heat exchanger 126 and/or one or more control valves to control the flow of fluid into the one or more fluid heating element(s) 125, including, for example, increasing or decreasing a temperature of the working fluid.

The control device 160 may also selectively control a heat source 127 providing heat to the heat exchanger 126. In some embodiments, the heat source 127 includes a resistive heating element. In some embodiments, heat source 127 provides waste heat or reclaimed heat (e.g., from a plasma source). Other heat sources 127 can be used without deviating from the scope of the present disclosure.

In some embodiments, the control device 160 can perform control operations (e.g., any of the operations discussed herein) based on signals received from a temperature sensor 165 indicative of the temperature of the workpiece 130 and/or workpiece support 120. The temperature sensor 165 can be any suitable sensor (e.g., contact or non-contact) configured to obtain measurements that can be processed to estimate a temperature of the workpiece 130 and/or workpiece support 120. The signals from the temperature sensor 165 can be used for closed loop control of the workpiece 130 temperature during the post exposure bake (PEB) process.

In some embodiments, the control device 160 can include a processor and associated memory configured to perform a variety of computer-implemented functions. As used herein, the term "processor" refers not only to integrated circuits referred to in the art as being included in a computer, but also refers to a controller, microcontroller, a microcomputer, a programmable logic controller (PLC), an application specific integrated circuit (ASIC), a Field Programmable Gate Array (FPGA), and other programmable circuits. Additionally, the memory can include memory element(s) including, but not limited to, computer readable medium (e.g., random access memory (RAM)), computer readable non-volatile medium (e.g., flash memory), and/or other suitable memory elements or combinations thereof. Additionally, the control device 160 can include a communications interface. In some implementations, the communications interface can include associated electronic circuitry that is used to send and receive data.

Figure 2:
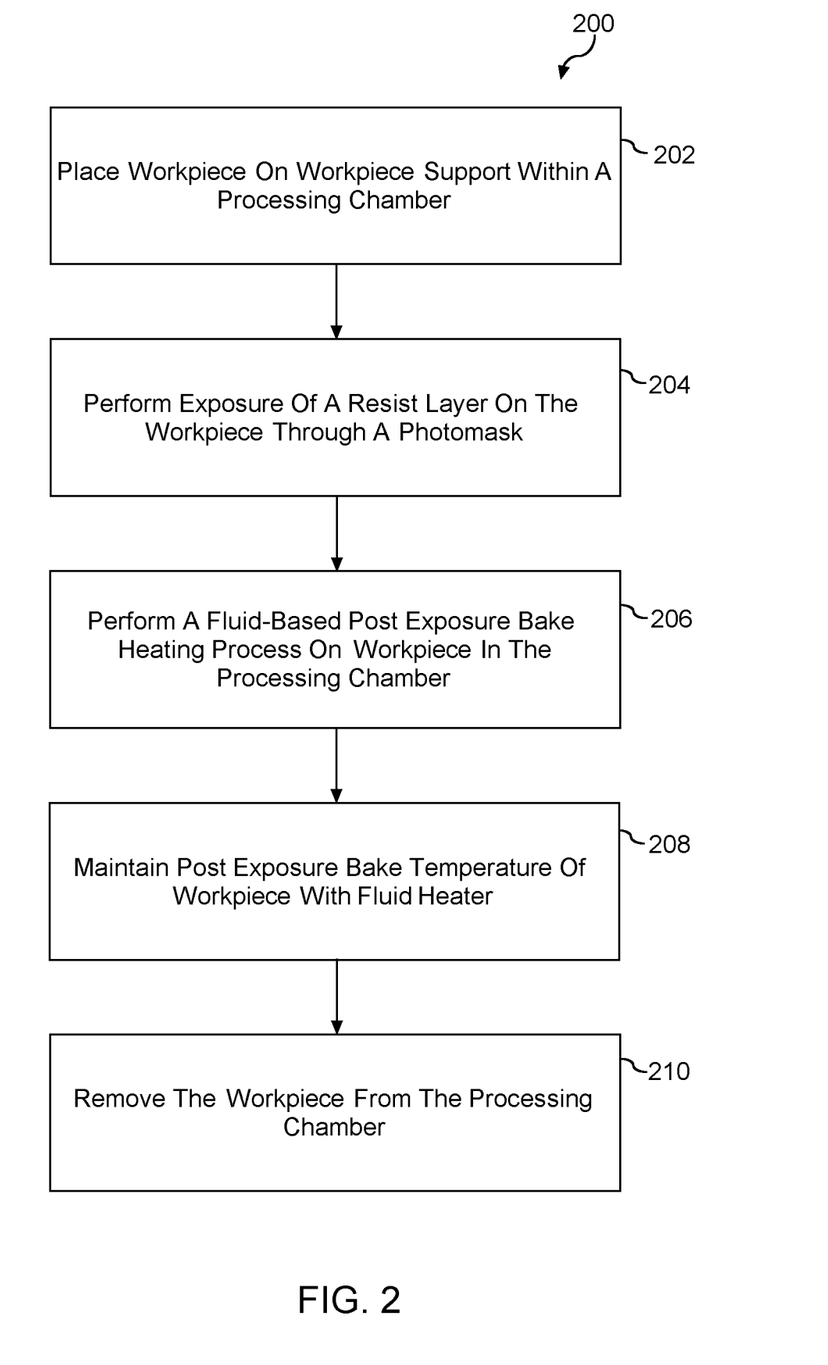
FIG. 2 depicts a flow diagram of an example method according to example embodiments of the present disclosure.

FIG. 2 depicts a flow diagram of an example method 200 for implementing a fluid-based PEB heating process on a CAR layer of a workpiece according to example embodiments of the present disclosure. FIG. 2 depicts steps performed in a particular order for purposes of illustration and discussion. Those of ordinary skill in the art, using the disclosure provided herein, will understand that various steps of the multi-cycle thermal treatment process described herein can be omitted, expanded, performed simultaneously, rearranged, and/or modified in various ways without deviating from the scope of the present disclosure. In addition, various additional steps (not illustrated) can be performed without deviating from the scope of the present disclosure.

At (202), the method 200 can including placing the workpiece on a workpiece support disposed within a processing chamber. For instance, the workpiece 130 can be placed on the workpiece support 120. The workpiece support 120 can include one or more fluid-based heating element(s) 125. Each fluid-based heating element 125 can include, for instance, a channel for the flow of fluid, such as liquid fluid.

At (204), the method 200 can including performing exposure of a resist layer on the workpiece through a photomask. For instance, the photomask can comprise a pattern to be etched on at least a portion of the workpiece. The photomask can comprise a pattern at the same scale as the pattern to be etched onto the workpiece. Additionally and/or alternatively, the photomask can comprise a pattern at a different scale than the pattern to be etched onto the workpiece, such as a larger pattern and/or a smaller pattern. The photomask and the resist layer can be exposed to radiation to etch the pattern on the photomask onto the resist layer. Additional exposure of photoresist to radiation of the selective wavelength (e.g. exposure to radiation other than the radiation of the selective wavelength used to transfer the pattern on the photomask to the photoresist layer) can be avoided in PEB process.

At (206), the method 200 can include performing a fluid-based PEB heating process using the one or more fluid heating elements in the workpiece. For instance, the PEB heating process can include transmitting heated fluid through a fluid heating element associated with the workpiece support until a temperature of the workpiece reaches a PEB setpoint temperature. In some embodiments, the PEB setpoint temperature can be between about 60° C. and about 150° C. In some embodiments, the workpiece can be heated to the PEB setpoint temperature in less than about 15 seconds, such as less than about 5 seconds.

As an example, referring to FIG. 1, a heat exchanger 126 can be in fluid connection with the fluid heating element(s) 125 in the workpiece support. The heat exchanger 126 can be configured to transmit heating fluid to fluid input 122 of the fluid heating element(s) 125. Similarly, the heat exchanger is configured to receive fluid from the fluid output 124 of the fluid heating element(s) 125. In this way, the fluid can be in circulation in a fluid connection between the fluid heating element(s) 125 and the heat exchanger 126.

In some embodiments, the fluid is a working liquid fluid chosen from the group consisting of water, oil, glycol, or a mixture thereof. In some embodiments, the working liquid fluid is ethylene glycol. In other embodiments, the working fluid is chosen specifically for a particular target operating temperature of PEB setpoint temperature. As an example, the working fluid can be water when the PEB setpoint temperature can be in the range of about 60° C. to about 80° C. Other suitable working fluids may be chosen based on any desired or required PEB heating setpoint temperature.

In some embodiments, the heat exchanger 126 receives heat from a resistive heating element. In some embodiments, the heat exchanger 126 receives waste heat or reclaimed heat. Other heat sources for the heat exchanger 126 are also applicable (e.g., a plasma heat source).

At (208), the method 200 can include maintaining the PEB setpoint temperature of the workpiece using the fluid heater. For instance, fluid heater(s) may circulate fluid heated at a substantially consistent temperature for a PEB processing period. The duration of the PEB processing period can vary based on a type of layer 136 and a variety of other factors. At (210), once the PEB processing period is complete, the method 200 can include removing the workpiece from the processing chamber.

Figure 3:
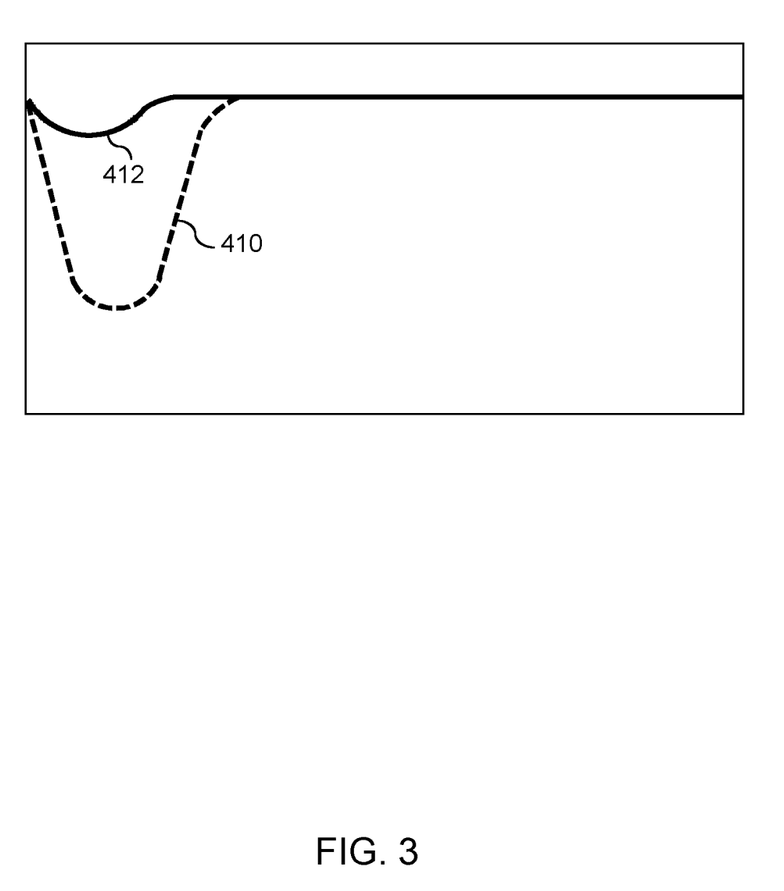
FIG. 3 depicts a graphical representation of a workpiece support temperature during a fluid-based post exposure bake process according to example embodiments of the present disclosure.

FIG. 3 depicts a graphical representation of workpiece support temperature as a function of time during a fluid based PEB heating process according to example embodiments of the present disclosure. FIG. 3 plots time along the horizontal axis and workpiece support temperature along the vertical axis. Curve 410 depicts workpiece support temperature for a workpiece support incorporating resistive heating elements. As discussed above, there can be a large dip in the workpiece support temperature when the colder workpiece first contacts hot surface of the workpiece support. This can lead to a long heating time to reach the PEB setpoint temperature. The long heating time can result in a long acid diffusion length for a CAR layer on the workpiece, and can result in a poor CD control.

Curve 412 depicts workpiece support temperature for a workpiece support incorporating one or more fluid heating elements according to example embodiments of the present disclosure. In comparison to Curve 410 for the workpiece support temperature for a workpiece support incorporating resistive heating elements, the initial dip in workpiece support temperature when the workpiece first contacts the workpiece support is reduced in Curve 412 for the workpiece support incorporating on or more fluid heating elements. This can lead to a faster time (e.g., less than about 15 seconds) for the temperature of the workpiece to reach the PEB setpoint temperature. Accordingly, acid diffusion length for the CAR layer on the workpiece can be more tightly controlled.

Figure 4:
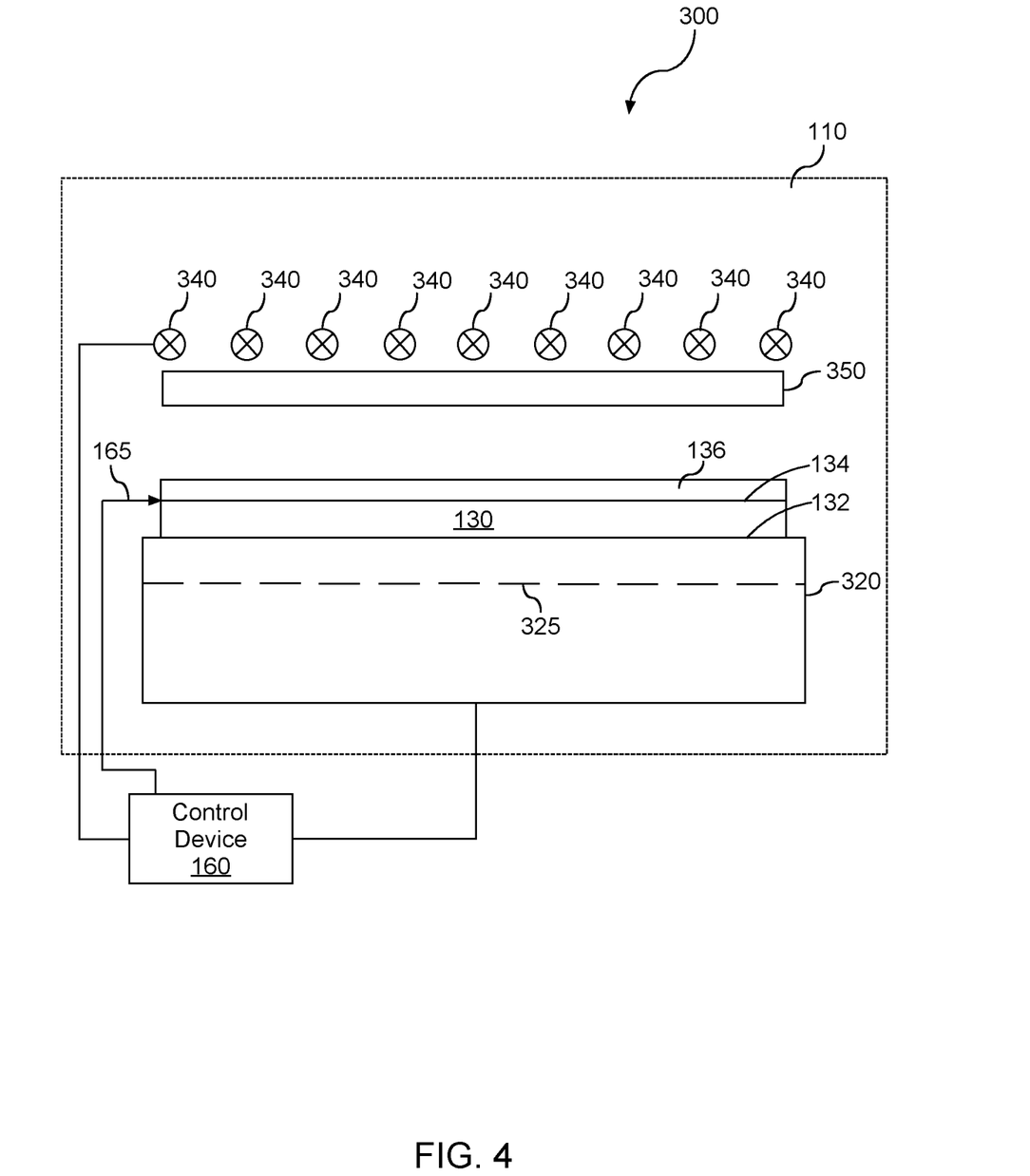
FIG. 4 depicts an example workpiece processing apparatus according to example embodiments of the present disclosure.

FIG. 4 depicts a workpiece processing apparatus 300 that can be used to perform PEB processes on a workpiece having photoresist layers (e.g., CAR layers) according to example embodiments of the present disclosure. As illustrated, the workpiece processing apparatus 300 includes a processing chamber 110. The processing chamber 110 can include a workpiece support 320 operable to support a workpiece to be processed. The workpiece support 320 can include one or more heating elements 325, such as resistive heating elements. In some embodiments, a workpiece 130 can be placed on the workpiece support 320 such that a non-device side surface 132 of the workpiece 130 contacts the heater 320. As further shown, the workpiece 130 includes a CAR layer 136 disposed on the device side surface 134 of the workpiece 130.

In some embodiments, the workpiece processing apparatus 300 can include one or more lamps 340 configured to emit energy onto the workpiece 130. More specifically, the one or more lamps 340 can emit light onto the CAR layer 136 of the workpiece 130 to at least partially implement a PEB process on the CAR layer.

Each of the lamps 340 can be, for instance, an arc lamp, halogen lamp, incandescent lamps, or other lamp heat source (e.g., light emitting diode (LED) lamp heat source). Aspects of the present disclosure are discussed with reference to lamps 340 for purposes of illustration and discussion. Those of ordinary skill in the art, using the disclosures provided herein, will understand that any radiant heat source can be used in place of lamps 340.

In photolithography, the photoresist layer such as CAR layer on the workpiece is exposed to radiation of selective wavelength through a patterned photomask to transfer the pattern on the photomask to the photoresist layer. For instance, the photomask can comprise a pattern to be etched on at least a portion of the workpiece. The photomask can comprise a pattern at the same scale as the pattern to be etched onto the workpiece. Additionally and/or alternatively, the photomask can comprise a pattern at a different scale than the pattern to be etched onto the workpiece, such as a larger pattern and/or a smaller pattern. Additional exposure of photoresist to radiation of the selective wavelength (e.g., exposure to radiation other than the radiation of the selective wavelength used to transfer the pattern on the photomask to the photoresist layer) should be avoided in PEB process.

In some embodiments, a filter 350 can be placed between lamps 340 and the workpiece 130. The filter can be at least partially opaque to radiation within a band of wavelengths. For instance, the filter can block at least a portion of photons having a wavelength in the wavelength band that are incident on the filter (e.g. photons from the lamps 340) from transmitting through the filter. Thus, the filter can at least partially block radiation in the band, preventing the photoresist layer from being exposed to the radiation in the band.

Figure 5:
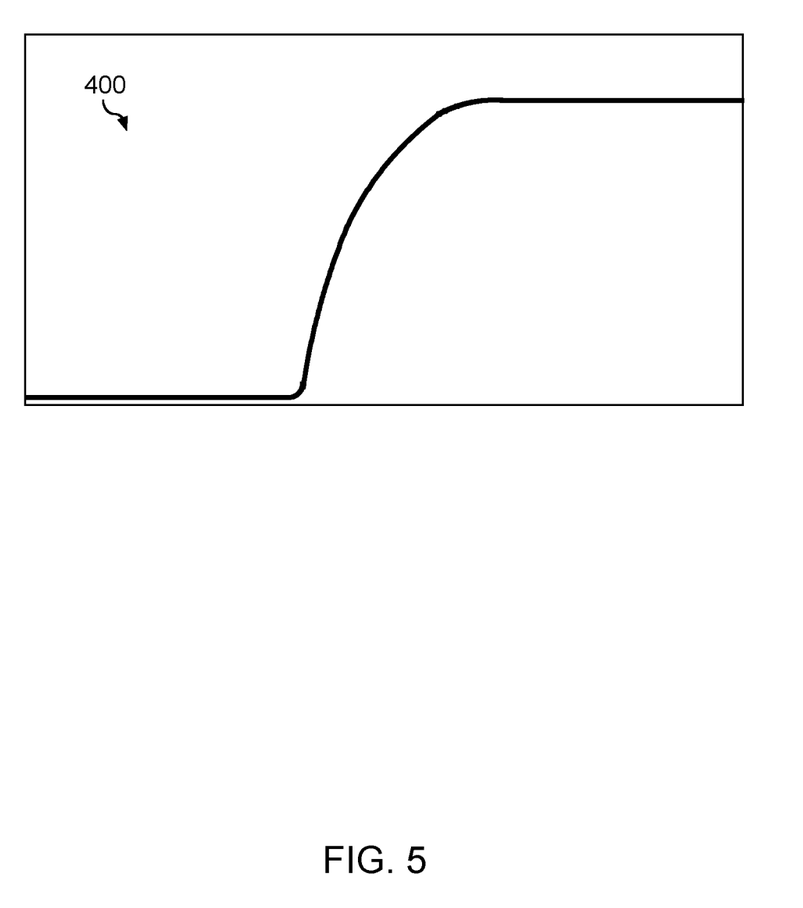
FIG. 5 depicts a graphical representation of transmission of radiation of different wavelengths through an example filter according to example embodiments of the present disclosure.

FIG. 5 illustrates a graphical representation 400 of light transmission through an example filter as a function of light wavelength. For instance, wavelength can be on the ordinate, and transmission (e.g. as a percentage of incident radiation) can be on the abscissa. As can be seen in FIG. 5, the filter can be substantially transparent to radiation at one wavelength (e.g. radiation near the right end of the ordinate) and substantially opaque to other wavelengths (e.g. radiation near the left end of the ordinate).

In some embodiments, the workpiece processing apparatus 300 can include a control device 160 that is operatively coupled to the one or more lamps 340 and/or the one or more heating elements 325 in the workpiece support 320. In this manner, the control device 160 can be configured to control operation of the one or more lamps 340 and/or the one or more heating elements 325.

The control device 160 may also selectively control a heat source 127 providing heat to the heat exchanger 126. In some embodiments, the heat source 127 includes a resistive heating element. In some embodiments, heat source 127 provides waste heat or reclaimed heat (e.g., from a plasma source). Other heat sources 127 can be used without deviating from the scope of the present disclosure.

In some embodiments, the control device 160 can perform control operations (e.g., any of the operations discussed herein) based on signals received from a temperature sensor 165 indicative of the temperature of the workpiece 130 and/or workpiece support 120. The temperature sensor 165 can be any suitable sensor (e.g., contact or non-contact) configured to perform temperature measurements that can be processed to estimate a temperature of the workpiece 130 and/or workpiece support 120. The signals from the temperature sensor 165 can be used for a closed loop control of the workpiece 130 temperature during the post exposure bake process. For instance, the control device 160 can deenergize the one or more lamps 340 when signals from the temperature sensor are indicative of the temperature of the workpiece 130 reaching the PEB setpoint temperature.

In some embodiments, the control device 160 can include a processor and associated memory configured to perform a variety of computer-implemented functions. As used herein, the term "processor" refers not only to integrated circuits referred to in the art as being included in a computer, but also refers to a controller, microcontroller, a microcomputer, a programmable logic controller (PLC), an application specific integrated circuit (ASIC), a Field Programmable Gate Array (FPGA), and other programmable circuits. Additionally, the memory can include memory element(s) including, but not limited to, computer readable medium (e.g., random access memory (RAM)), computer readable non-volatile medium (e.g., flash memory), and/or other suitable memory elements or combinations thereof. Additionally, the control device 160 can include a communications interface. In some implementations, the communications interface can include associated electronic circuitry that is used to send and receive data.

Figure 6:
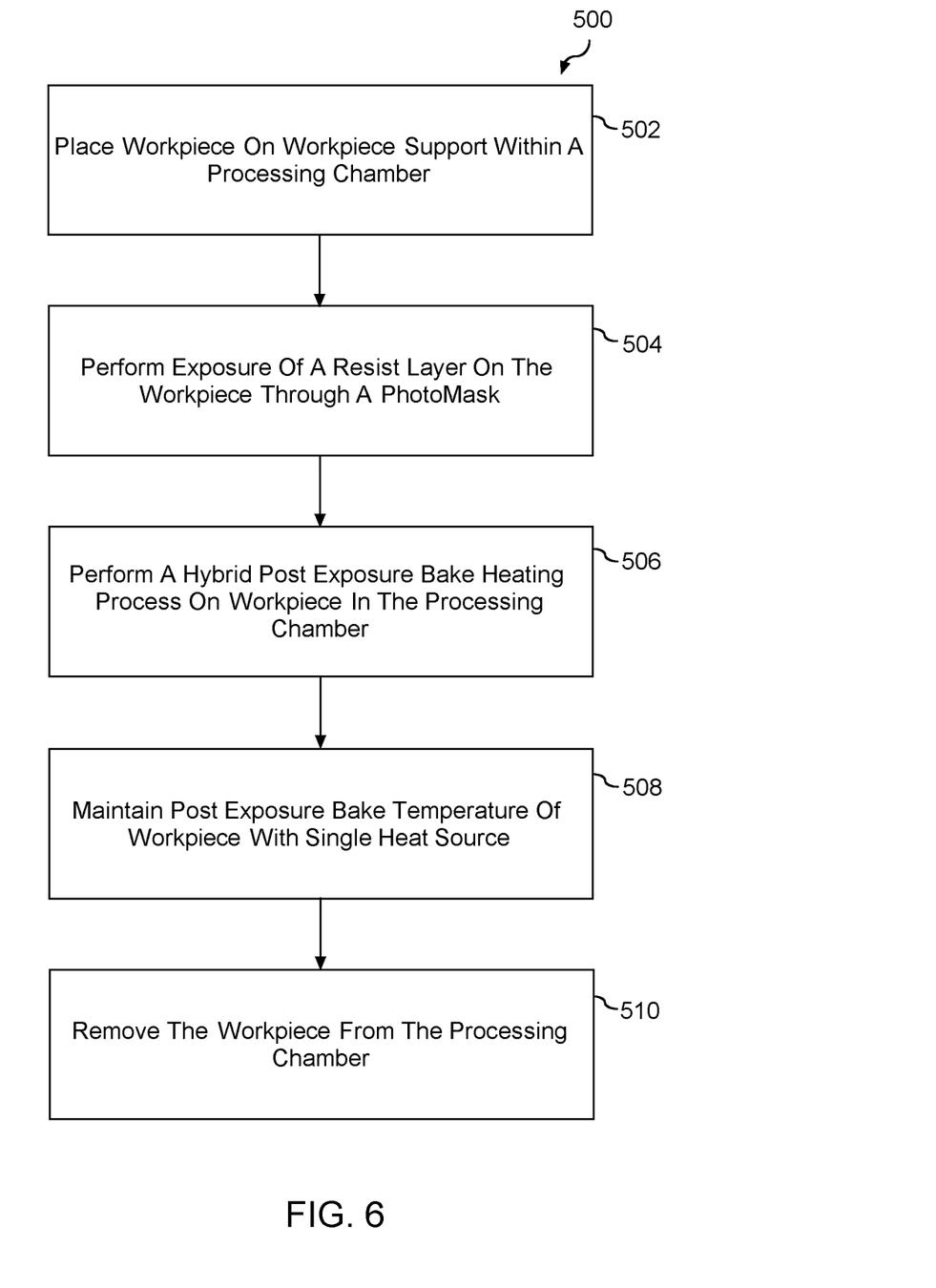
FIG. 6 depicts a flow diagram of an example method according to example embodiments of the present disclosure.

FIG. 6 depicts a flow diagram of an example method 500 for processing a workpiece according to example aspects of the present disclosure. The method 500 can be implemented using the workpiece processing apparatus 300 discussed above with reference to FIG. 4. However, it should be appreciated that the method 500 can be implemented using other approaches without deviating from the scope of the present disclosure.

It should be appreciated that FIG. 6 depicts steps performed in a particular order for purposes of illustration and discussion. However, those of ordinary skill in the art, using the disclosure provided herein, will understand that various steps of the method 500 described herein can be omitted, expanded, performed simultaneously, rearranged, and/or modified in various ways without deviating from the scope of the present disclosure. In addition, various additional steps (not illustrated) can be performed without deviating from the scope of the present disclosure.

At (502), the method 500 can including placing the workpiece on the heating element disposed within the processing chamber. For instance, the workpiece 130 can be placed on the workpiece support 320. The workpiece support 320 can include one or more heating elements 325 (e.g., resistive heating element or fluid-based heating element).

At (504), the method 500 can including performing exposure of a resist layer on the workpiece through a photomask. For instance, the photomask can comprise a pattern to be etched on at least a portion of the workpiece. The photomask can comprise a pattern at the same scale as the pattern to be etched onto the workpiece. Additionally and/or alternatively, the photomask can comprise a pattern at a different scale than the pattern to be etched onto the workpiece, such as a larger pattern and/or a smaller pattern. The photomask and the resist layer can be exposed to radiation to etch the pattern on the photomask onto the resist layer. Additional exposure of photoresist to radiation of the selective wavelength (e.g. exposure to radiation other than the radiation of the selective wavelength used to transfer the pattern on the photomask to the photoresist layer) should be avoided in PEB process.

At (506), the method 500 can include performing a hybrid PEB heating process on the workpiece. A hybrid PEB heating process can include using both heating elements associated with the workpiece support and radiative heating (e.g., lamps) during the initial ramp up of the workpiece temperature to the PEB setpoint temperature. Once the workpiece temperature is at approximately the PEB setpoint temperature, the heating elements associated with the workpiece support can be used to maintain the temperature of the workpiece at approximately the PEB setpoint temperature.

For instance, during the initial ramp up of the workpiece temperature to the PEB setpoint temperature, both the heating elements 325 (FIG. 4) and the lamp heat sources 340 can be used to heat the workpiece. Once the temperature of the workpiece is approximately at the PEB setpoint temperature, the heating elements 325 can be used to maintain the workpiece temperature at approximately the PEB setpoint temperature.

In this regard at (508), the method 500 can include maintaining the PEB setpoint temperature of the workpiece using the second heat source for a PEB processing period. In some embodiments, the lamps 340 may be de-energized and the second heat source can be operated such that the PEB setpoint temperature is maintained throughout the PEB process.

At (510), the method 500 can include removing the workpiece from the processing chamber after the PEB processing period has been completed. The PEB processing period can vary based on a type of resist (e.g. CAR layer 136) and a variety of other factors.

Figure 7:
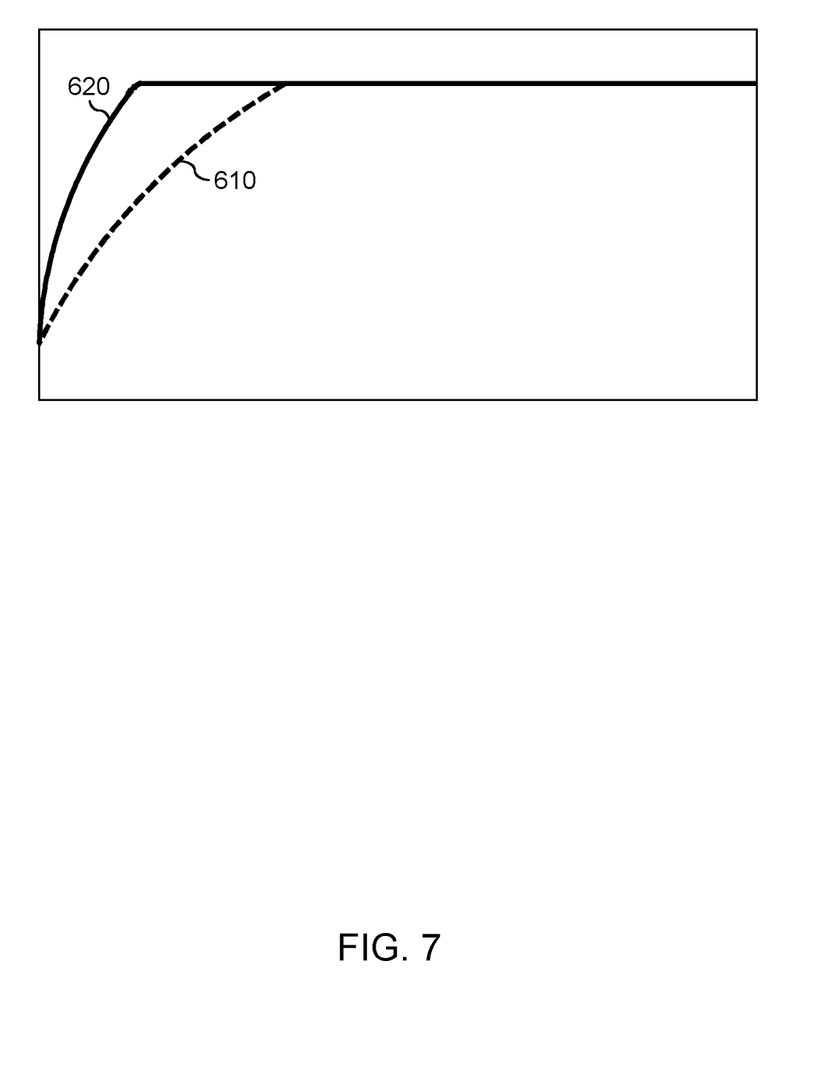
FIG. 7 depicts a graphical representation of a workpiece temperature during a hybrid post exposure bake process according to example embodiments of the present disclosure.

FIG. 7 depicts a graphical representation of workpiece temperature as a function of time during a hybrid PEB heating process according to example embodiments of the present disclosure. FIG. 7 plots time along the horizontal axis and workpiece temperature along the vertical axis. Curve 610 depicts workpiece temperature when heating the workpiece using only heating elements incorporated into a workpiece support. Curve 620 depicts workpiece temperature during a hybrid PEB heating process according to example embodiments of the present disclosure. As shown, the hybrid PEB heating process can lead to a faster time (e.g., less than 15 seconds, such as less than 5 seconds) for the temperature of the workpiece to reach the PEB setpoint temperature. Accordingly, acid diffusion length for the CAR layer can be more tightly controlled.

FIGS. 6 and 7 have been discussed with reference to a hybrid PEB heating process that uses heating elements in the workpiece support in addition to radiant heat sources (e.g., lamps). The hybrid PEB heating process according to example embodiments of the present disclosure can be implemented using resistive heating elements in the workpiece support. The hybrid PEB heating process according to example embodiments of the present disclosure can also be implemented using fluid-based heating elements in the workpiece support.

Figure 8:
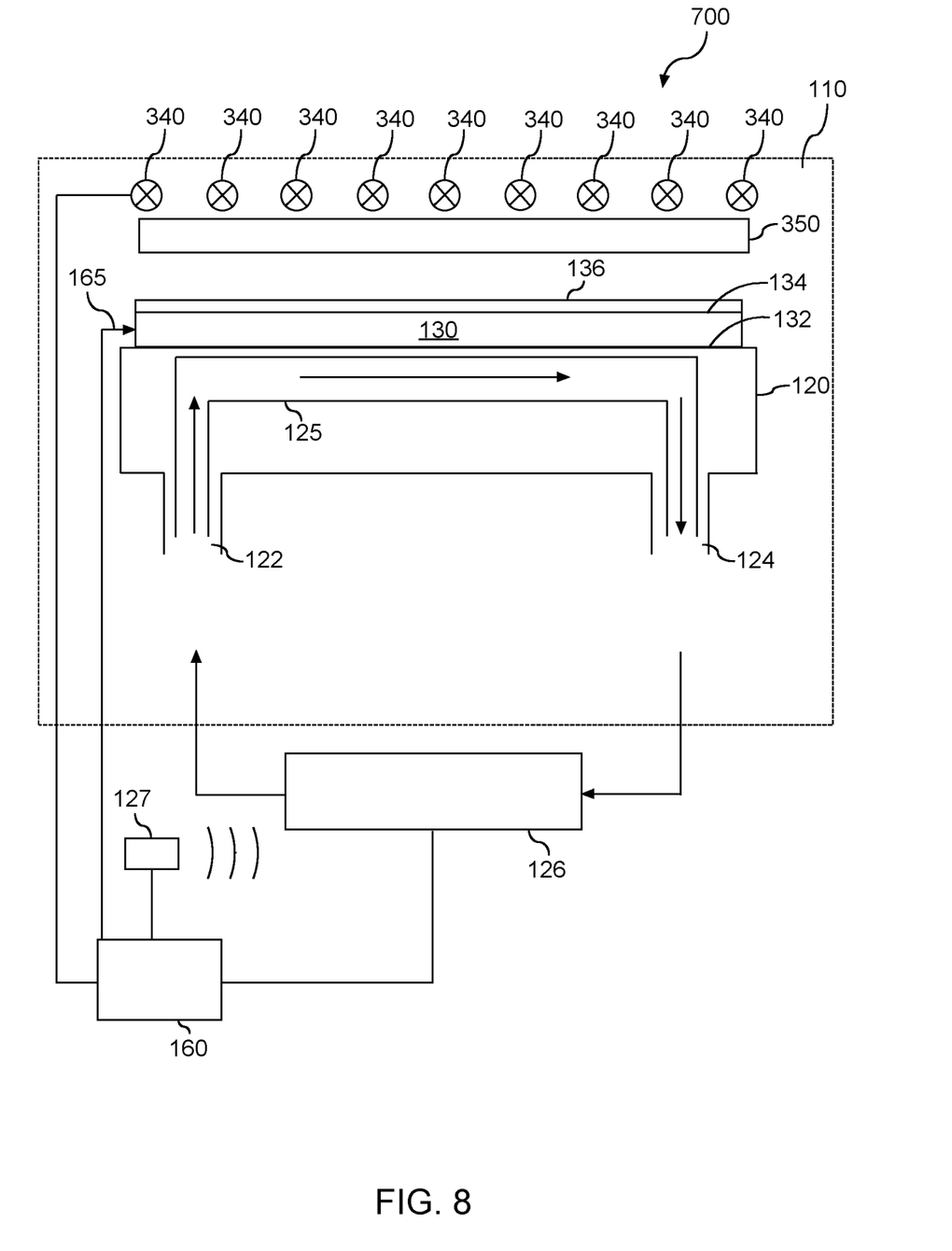
FIG. 8 depicts an example workpiece processing apparatus according to example embodiments of the present disclosure.

FIG. 8 depicts a workpiece processing apparatus 700 that can be used to perform processes according to example embodiments of the present disclosure. The workpiece processing apparatus 700 can include a processing chamber 110. The processing chamber 110 can include a workpiece support 120 operable to support a workpiece 130 to be processed, such as a semiconductor wafer. The workpiece support 120 can include one or more fluid-based heating element(s) 125 for regulating the temperature of the workpiece support 120. In some embodiments, the workpiece 130 can be placed on the fluid-based heating element(s) 125 such that a non-device side surface 132 of the workpiece 130 contacts the workpiece support 120. As further shown, the workpiece 130 includes a CAR layer 136 disposed on the device side 134 of the workpiece 130.

In some embodiments, the workpiece processing apparatus 700 can further include a heat exchanger 126 in fluid connection with the fluid-based heating element(s) 125. The heat exchanger 126 can be configured to transmit heating fluid to fluid input 122 of the fluid-based heating element(s) 125. Similarly, the heat exchanger can be configured to receive fluid from the fluid output 124 of the fluid-based heating element(s) 125. In this way, the fluid (e.g. as a liquid) can be in circulation in a fluid connection between the fluid heating element(s) 125 and the heat exchanger 126.

In some embodiments, the fluid is a working liquid fluid chosen from the group consisting of water, oil, glycol, or a mixture thereof. In some embodiments, the working liquid fluid is ethylene glycol. In some embodiments, the working fluid is chosen specifically for a particular target operating temperature of PEB setpoint temperature. As an example, the working fluid can be water when the PEB setpoint temperature is in the range of about 60° C. to about 80° C. Other suitable working fluids may be chosen based on any desired or required PEB heating setpoint temperature.

The lamps 340 can be, for instance, an arc lamp, halogen lamp, incandescent lamps, or other lamp heat source (e.g., light emitting diode (LED) lamp heat source). Aspects of the present disclosure are discussed with reference to lamps 340 for purposes of illustration and discussion. Other heat sources, such as but not limited to a hot wall environment, a hot plate or susceptor, a hot gas stream, radiant heat sources, such as lasers, heat sources producing particle beams, heat sources producing RF, or heat sources producing microwave, can be used without deviating from the scope of the present disclosure.

In some embodiments, a filter 350 is placed between lamps 340 and the workpiece 130. The filter can be at least partially transparent to radiation within a band of wavelengths. For instance, the filter can block at least a portion of photons having a wavelength in the wavelength band that are incident on the filter (e.g. photons from the lamps 340) from transmitting through the filter. Thus, the filter can at least partially block radiation in the band, preventing the photoresist layer from being exposed to the radiation in the band.

In some embodiments, the workpiece processing apparatus 300 can include a control device 160 that is operatively coupled to the one or more lamps 340 and to the heat exchanger 126. In this manner, the control device 160 can control operation of the one or more lamps 340. The control device 160 can also be configured to control operation of the heat exchanger 126, including, for example, increasing or decreasing temperature of the working fluid. The control device may also selectively control a heat source providing heat to the heat exchanger 126.

The control device 160 may also selectively control a heat source 127 providing heat to the heat exchanger 126. In some embodiments, the heat source 127 includes a resistive heating element. In some embodiments, heat source 127 provides waste heat or reclaimed heat (e.g., from a plasma source). Other heat sources 127 can be used without deviating from the scope of the present disclosure.

In some embodiments, the control device 160 can perform control operations (e.g., any of the operations discussed herein) based on signals received from a temperature sensor 165. The temperature sensor 165 can be any suitable sensor (e.g., contact or non-contact) configured to obtain measurements that can be processed to estimate a temperature of the workpiece 130 and/or workpiece support 120. The signals from the temperature sensor 165 can be used for a closed loop control of the workpiece 130 temperature during the post exposure bake (PEB) process. For instance, the control device 160 can deenergize the one or more lamps 340 when signals from the temperature sensor are indicative of the temperature of the workpiece 130 reaching the PEB setpoint temperature.

In some embodiments, the control device 160 can include a processor and associated memory configured to perform a variety of computer-implemented functions. As used herein, the term "processor" refers not only to integrated circuits referred to in the art as being included in a computer, but also refers to a controller, microcontroller, a microcomputer, a programmable logic controller (PLC), an application specific integrated circuit (ASIC), a Field Programmable Gate Array (FPGA), and other programmable circuits. Additionally, the memory can include memory element(s) including, but not limited to, computer readable medium (e.g., random access memory (RAM)), computer readable non-volatile medium (e.g., flash memory), and/or other suitable memory elements or combinations thereof. Additionally, the control device 160 can include a communications interface. In some implementations, the communications interface can include associated electronic circuitry that is used to send and receive data.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for processing a workpiece, the method comprising:
    placing a workpiece having a photoresist layer on a workpiece support disposed within a processing chamber;
    exposing the photoresist layer to photons of a wavelength through a photomask;
    performing a post exposure bake heating process on the workpiece having the photoresist layer, wherein the post exposure bake heating process comprises heating the workpiece with both a radiant heat source and a second heat source disposed in the workpiece support until a temperature of the workpiece reaches a post exposure bake setpoint temperature; and
    deenergizing the radiant heat source once the workpiece reaches the post exposure bake setpoint temperature while maintaining heating of the workpiece by the second heat source.

2. The method of claim 1, wherein the post exposure bake heating process heats the workpiece to approximately the post exposure bake setpoint temperature in less than about 15 seconds.

3. The method of claim 1, wherein the post exposure bake heating process heats the workpiece to approximately the post exposure bake setpoint temperature in less than about 5 seconds.

4. The method of claim 1, wherein the post exposure bake setpoint temperature is between about 60° C. and about 150° C.

5. The method of claim 1, wherein the radiant heat source comprises one or more incandescent lamps.

6. The method of claim 1, wherein a filter is placed between the radiant heat source and the workpiece in the post exposure bake heating process, the filter being at least partially opaque to transmission of second photons from the radiant heat source.

7. The method of claim 1, wherein the radiant heat source comprises one or more light emitting diodes.

8. The method of claim 1, wherein the second heat source comprises one or more resistive heating elements disposed in the workpiece support.

9. The method of claim 1, wherein the second heat source comprises one or more fluid-based heating elements disposed in the workpiece support.

10. The method of claim 9, wherein the one or more fluid-based heating elements in the second heat source are in a fluid connection with a heat exchanger, and a fluid is in circulation between the one or more fluid-based heating elements in the second heat source and the heat exchanger in the post exposure bake heating process.

11. The method of claim 10, wherein the fluid is a working liquid fluid comprising one or more of water, oil, and a glycol.

12. The method of claim 1, wherein the photoresist layer is a chemically amplified resist layer.

* * * * *